(12) United States Patent
Franklin et al.

(10) Patent No.: US 12,061,345 B2
(45) Date of Patent: *Aug. 13, 2024

(54) HEAD-MOUNTED ELECTRONIC DISPLAY DEVICE WITH LENS POSITION SENSING

(71) Applicant: Apple Inc., Cupertino, CA (US)

(72) Inventors: Jeremy C. Franklin, San Francisco, CA (US); Jia Tao, San Jose, CA (US); Phil M. Hobson, Menlo Park, CA (US); Stephen E. Dey, Capitola, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/330,072

(22) Filed: Jun. 6, 2023

(65) Prior Publication Data

US 2023/0314820 A1 Oct. 5, 2023

Related U.S. Application Data

(63) Continuation of application No. 17/379,187, filed on Jul. 19, 2021, now Pat. No. 11,726,338, which is a
(Continued)

(51) Int. Cl.
*G02B 27/01* (2006.01)
*G02B 7/02* (2021.01)
(Continued)

(52) U.S. Cl.
CPC ......... *G02B 27/0176* (2013.01); *G02B 7/021* (2013.01); *G02B 27/0179* (2013.01);
(Continued)

(58) Field of Classification Search
CPC ............. G06F 1/163; G06F 3/011–017; G02B 27/0176; G02B 27/0179
See application file for complete search history.

(56) References Cited

U.S. PATENT DOCUMENTS 6,496,161 B1 12/2002 Tanaka
8,184,067 B1 5/2012 Braun et al.
(Continued)

FOREIGN PATENT DOCUMENTS

CN 104781873 A 7/2015
CN 105745569 A 7/2016
(Continued)

*Primary Examiner* — Patrick F Marinelli
(74) *Attorney, Agent, or Firm* — Treyz Law Group, P.C.; G. Victor Treyz; David K. Cole (57) ABSTRACT

A head-mounted device may have a display with first and second pixel arrays that display content for a user. A head-mounted support structure in the device supports the pixel arrays on the head of the user. A left positioner may be used to position a left lens module that includes a left lens and the first pixel array. A right positioner may be used to position a right lens module that includes a right lens and the second pixel array. Sensing circuitry such as proximity sensing circuitry may be used to detect relative positions between the left and right lens modules and facing surfaces of a user's nose while the user is wearing the head-mounted support structure. Control circuitry may adjust the positions of the left and right lens modules using interpupillary distance information for the user and using information from the sensing circuitry.

20 Claims, 7 Drawing Sheets

Related U.S. Application Data continuation of application No. 17/031,681, filed on Sep. 24, 2020, now Pat. No. 11,126,004, which is a continuation of application No. 16/280,803, filed on Feb. 20, 2019, now Pat. No. 10,823,970.

(60) Provisional application No. 62/721,943, filed on Aug. 23, 2018.

(51) Int. Cl.
*G02B 27/09* (2006.01)
*G06F 1/16* (2006.01)
*G06F 3/01* (2006.01)
*H04N 13/383* (2018.01)
*H05K 1/02* (2006.01)
*H05K 1/18* (2006.01)

(52) U.S. Cl.
CPC ......... *G02B 27/0955* (2013.01); *G06F 1/163* (2013.01); *G06F 3/011* (2013.01); *G06F 3/013* (2013.01); *H04N 13/383* (2018.05); *H05K 1/0274* (2013.01); *H05K 1/189* (2013.01); *G02B 2027/0154* (2013.01)

(56) References Cited

U.S. PATENT DOCUMENTS

| | | | |
|---|---|---|---|
| 8,896,675 | B2 | 11/2014 | Moliton et al. |
| 10,250,870 | B2 | 4/2019 | Liang et al. |
| 10,445,860 | B2 | 10/2019 | Fix et al. |
| 10,573,042 | B2 | 2/2020 | Kaehler et al. |
| 10,823,970 | B2* | 11/2020 | Franklin .............. H04N 13/383 |
| 10,962,777 | B1* | 3/2021 | Wheelwright ....... G02B 27/425 |
| 11,042,130 | B2 | 6/2021 | Aghara et al. |
| 11,126,004 | B2* | 9/2021 | Franklin ................ H04N 13/383 |
| 11,822,091 | B2* | 11/2023 | Mulliken ................ G06F 3/012 |
| 2006/0072206 | A1 | 4/2006 | Tsuyuki et al. |
| 2009/0147358 | A1 | 6/2009 | Charlesworth |
| 2011/0194029 | A1 | 8/2011 | Herrmann et al. |
| 2013/0249849 | A1 | 9/2013 | Wong et al. |
| 2014/0126782 | A1 | 5/2014 | Takai et al. |
| 2015/0234189 | A1 | 8/2015 | Lyons |
| 2016/0363773 | A1 | 12/2016 | Tempel et al. |
| 2017/0344107 | A1* | 11/2017 | Aghara .................. G06F 3/011 |
| 2018/0096533 | A1 | 4/2018 | Osman |
| 2018/0335605 | A1 | 11/2018 | Chou et al. |
| 2019/0028697 | A1 | 1/2019 | Sullivan et al. |
| 2019/0129181 | A1 | 5/2019 | Polcak et al. |
| 2019/0250651 | A1* | 8/2019 | Liu .................... G05D 16/2066 |
| 2019/0302484 | A1* | 10/2019 | Zhang .................... G02C 5/143 |
| 2020/0064635 | A1* | 2/2020 | Franklin ............ G02B 27/0955 |
| 2020/0272022 | A1* | 8/2020 | Myhre ................. G02B 27/017 |
| 2021/0011298 | A1* | 1/2021 | Franklin ............ G02B 27/0176 |
| 2021/0068277 | A1* | 3/2021 | Mulliken .................. G01L 1/16 |
| 2021/0126066 | A1* | 4/2021 | Hwang ................. G09G 3/3266 |
| 2021/0349323 | A1* | 11/2021 | Franklin ............. G02B 27/0179 |
| 2021/0365113 | A1* | 11/2021 | Chalmers ........... G02B 27/0179 |
| 2023/0314820 | A1* | 10/2023 | Franklin ................ H05K 1/189 345/8 |

FOREIGN PATENT DOCUMENTS

| | | |
|---|---|---|
| CN | 106445167 A | 2/2017 |
| CN | 107533244 A | 1/2018 |
| CN | 207706338 U | 8/2018 |
| WO | 2017017924 A1 | 2/2017 |

\* cited by examiner

HEAD-MOUNTED ELECTRONIC DISPLAY DEVICE WITH LENS POSITION SENSING

This application is a continuation of U.S. patent application Ser. No. 17/379,187, filed Jul. 19, 2021, which is a continuation of U.S. patent application Ser. No. 17/031,681, filed Sep. 24, 2020, now U.S. Pat. No. 11,126,004, which is a continuation of U.S. patent application Ser. No. 16/280,803, filed Feb. 20, 2019, now U.S. Pat. No. 10,823,970, which claims the benefit of provisional patent application No. 62/721,943, filed Aug. 23, 2018, which are hereby incorporated by reference herein in their entireties.

BACKGROUND

This relates generally to electronic devices and, more particularly, to wearable electronic device systems.

Electronic devices are sometimes configured to be worn by users. For example, head-mounted devices are provided with head-mounted structures that allow the devices to be worn on users' heads. The head-mounted devices may include optical systems with lenses. The lenses allow displays in the devices to present visual content to users.

Users have faces of different shapes and sizes. This can pose challenges when a head-mounted device is to be used by multiple users. If care is not taken, a head-mounted device may not fit well for certain users.

SUMMARY

A head-mounted device may have a display that displays content for a user. Head-mounted support structures in the device support the display on the head of the user.

The head-mounted device may have lenses in lens modules. A left positioner may be used to position a left lens module. A right positioner may be used to position a right lens module. The left and right lens modules may have respective left and right lenses and respective left and right portions of a display.

To accommodate users with different interpupillary distances, the left and right lens modules may be moved towards or away from each other. To avoid excessive pressure on a user's nose, sensing circuitry such as proximity sensing circuitry may be used to detect relative positions between the left and right lens modules and facing surfaces of the user's nose. Control circuitry may adjust the lens modules using the interpupillary distance information for the user and using information from the sensing circuitry to prevent excessive pressure from the lens modules on the user's nose.

A user may supply the interpupillary distance of the user to the head-mounted device, an image sensor or other device may be used in measuring the interpupillary distance to provide to the head-mounted device, and/or gaze tracking sensors in the head-mounted device may measure the interpupillary distance of the user while the head-mounted device is being worn on the head of the user. In some configurations, a proximity sensor such as a capacitive proximity sensor may have electrodes on flexible printed circuits that are coupled to the gaze tracking sensors. Other sensing arrangements may be used to measure lens module positions relative to the user's nose, if desired.

DETAILED DESCRIPTION

Electronic devices may include displays and other components for presenting content to users. The electronic devices may be wearable electronic devices. A wearable electronic device such as a head-mounted device may have head-mounted support structures that allow the head-mounted device to be worn on a user's head.

A head-mounted device may contain a display formed from one or more display panels (displays) for displaying visual content to a user. A lens system may be used to allow the user to focus on the display and view the visual content. The lens system may have a left lens that is aligned with a user's left eye and a right lens that is aligned with a user's right eye.

Not all users have eyes that are separated by the same interpupillary distance. To ensure that a wide range of users are able to comfortably view content on the display, the head-mounted device may be provided with lens positioners. The lens positioners may be used in adjusting the lens-to-lens spacing between the left and right lenses to match the interpupillary distance of the user.

To prevent excessive pressure on the surface of the user's nose, proximity sensors can be used to automatically detect the surfaces of the user's nose. Control circuitry in the head-mounted device may then place the left and right lenses and corresponding left and right portions of the display at comfortable locations relative to the user's nose. In some situations, the left and right lenses may be spaced so that the lens-to-lens spacing between the left and right lenses matches the user's interpupillary distance. In other situations, the lens-to-lens spacing between the left and right lenses will be slightly larger than the user's interpupillary distance to ensure that the lenses do not press excessively against the user's nose. Sensor circuitry such as proximity sensor circuitry may be used to provide the control circuitry with real-time feedback on the positions of the lenses relative to the user's nose, thereby ensuring that the positions of the left and right lenses are adjusted satisfactorily.

Figure 1:
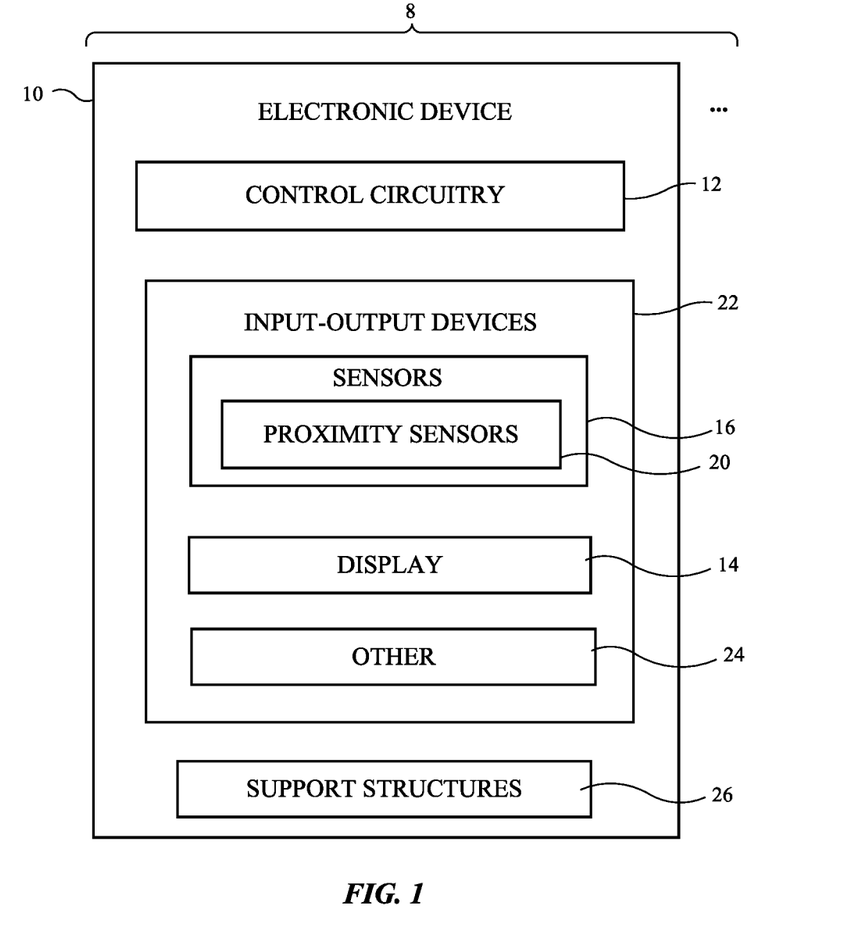
FIG. 1 is a schematic diagram of an illustrative electronic device such as a head-mounted display device in accordance with an embodiment.

A schematic diagram of an illustrative system having an electronic device with sensor circuitry that ensures satisfactory placement of lenses relative to a user's facial features is shown in FIG. 1. As shown in FIG. 1, system 8 may include one or more electronic devices such as electronic device 10. The electronic devices of system 8 may include computers, cellular telephones, head-mounted devices, wristwatch devices, and other electronic devices. Configurations in which electronic device 10 is a head-mounted device are sometimes described herein as an example.

As shown in FIG. 1, electronic devices such as electronic device 10 may have control circuitry 12. Control circuitry 12 may include storage and processing circuitry for controlling the operation of device 10. Circuitry 12 may include storage such as hard disk drive storage, nonvolatile memory (e.g., electrically-programmable-read-only memory configured to form a solid-state drive), volatile memory (e.g., static or dynamic random-access-memory), etc. Processing circuitry in control circuitry 12 may be based on one or more microprocessors, microcontrollers, digital signal processors, baseband processors, power management units, audio chips, graphics processing units, application specific integrated circuits, and other integrated circuits. Software code may be stored on storage in circuitry 12 and run on processing circuitry in circuitry 12 to implement control operations for device 10 (e.g., data gathering operations, operations involved in processing three-dimensional facial image data, operations involving the adjustment of components using control signals, etc.). Control circuitry 12 may include wired and wireless communications circuitry. For example, control circuitry 12 may include radio-frequency transceiver circuitry such as cellular telephone transceiver circuitry, wireless local area network (WiFi®) transceiver circuitry, millimeter wave transceiver circuitry, and/or other wireless communications circuitry.

During operation, the communications circuitry of the devices in system 8 (e.g., the communications circuitry of control circuitry 12 of device 10), may be used to support communication between the electronic devices. For example, one electronic device may transmit video and/or audio data to another electronic device in system 8. Electronic devices in system 8 may use wired and/or wireless communications circuitry to communicate through one or more communications networks (e.g., the internet, local area networks, etc.). The communications circuitry may be used to allow data to be received by device 10 from external equipment (e.g., a tethered computer, a portable device such as a handheld device or laptop computer, online computing equipment such as a remote server or other remote computing equipment, or other electrical equipment) and/or to provide data to external equipment.

Device 10 may include input-output devices 22. Input-output devices 22 may be used to allow a user to provide device 10 with user input. Input-output devices 22 may also be used to gather information on the environment in which device 10 is operating. Output components in devices 22 may allow device 10 to provide a user with output and may be used to communicate with external electrical equipment.

As shown in FIG. 1, input-output devices 22 may include one or more displays such as display 14. In some configurations, display 14 of device 10 includes left and right display panels (sometimes referred to as left and right portions of display 14 and/or left and right displays) that are in alignment with the user's left and right eyes, respectively. In other configurations, display 14 includes a single display panel that extends across both eyes.

Display 14 may be used to display images. The visual content that is displayed on display 14 may be viewed by a user of device 10. Displays in device 10 such as display 14 may be organic light-emitting diode displays or other displays based on arrays of light-emitting diodes, liquid crystal displays, liquid-crystal-on-silicon displays, projectors or displays based on projecting light beams on a surface directly or indirectly through specialized optics (e.g., digital micromirror devices), electrophoretic displays, plasma displays, electrowetting displays, or any other suitable displays.

Display 14 may present computer-generated content such as virtual reality content and mixed reality content to a user. Virtual reality content may be displayed in the absence of real-world content. Mixed reality content, which may sometimes be referred to as augmented reality content, may include computer-generated images that are overlaid on real-world images. The real-world images may be captured by a camera (e.g., a forward-facing camera) and merged with overlaid computer-generated content or an optical coupling system may be used to allow computer-generated content to be overlaid on top of real-world images. As an example, a pair of mixed reality glasses or other augmented reality head-mounted display may include a display device that provides images to a user through a beam splitter, prism, holographic coupler, or other optical coupler. Configurations in which display 14 is used to display virtual reality content to a user through lenses are described herein as an example.

Input-output circuitry 22 may include sensors 16. Sensors 16 may include, for example, three-dimensional sensors (e.g., three-dimensional image sensors such as structured light sensors that emit beams of light and that use two-dimensional digital image sensors to gather image data for three-dimensional images from light spots that are produced when a target is illuminated by the beams of light, binocular three-dimensional image sensors that gather three-dimensional images using two or more cameras in a binocular imaging arrangement, three-dimensional lidar (light detection and ranging) sensors, three-dimensional radio-frequency sensors, or other sensors that gather three-dimensional image data), cameras (e.g., infrared and/or visible digital image sensors), gaze tracking sensors (e.g., a gaze tracking system based on an image sensor and, if desired, a light source that emits one or more beams of light that are tracked using the image sensor after reflecting from a user's eyes), touch sensors, buttons, force sensors, sensors such as contact sensors based on switches, gas sensors, pressure sensors, moisture sensors, magnetic sensors, audio sensors (microphones), ambient light sensors, microphones for gathering voice commands and other audio input, sensors that are configured to gather information on motion, position, and/or orientation (e.g., accelerometers, gyroscopes, compasses, and/or inertial measurement units that include all of these sensors or a subset of one or two of these sensors), fingerprint sensors and other biometric sensors, optical position sensors (optical encoders), and/or other position sensors such as linear position sensors, and/or other sensors. A shown in FIG. 1, sensors 16 may include sensing circuitry (sensor circuitry) that is configured to measure the separation between objects in system 8. The sensing circuitry may include one or more sensors such as proximity sensors 20 (e.g., capacitive proximity sensors, light-based (optical) proximity sensors, ultrasonic proximity sensors, and/or other proximity sensors). Sensing circuitry such as proximity sensors 20 may, for example, be used to sense relative positions between a user's nose and lens modules in device 10.

User input and other information may be gathered using sensors and other input devices in input-output devices 22. If desired, input-output devices 22 may include other devices 24 such as haptic output devices (e.g., vibrating components), light-emitting diodes and other light sources, speakers such as ear speakers for producing audio output, and other electrical components. Device 10 may include circuits for receiving wireless power, circuits for transmitting power wirelessly to other devices, batteries and other energy storage devices (e.g., capacitors), joysticks, buttons, and/or other components.

Electronic device 10 may have housing structures (e.g., housing walls, straps, etc.), as shown by illustrative support structures 26 of FIG. 1. In configurations in which electronic device 10 is a head-mounted device (e.g., a pair of glasses, goggles, a helmet, a hat, etc.), support structures 26 may include head-mounted support structures (e.g., a helmet housing, head straps, temples in a pair of eyeglasses, goggle housing structures, and/or other head-mounted structures). The head-mounted support structures may be configured to be worn on a head of a user during operation of device 10 and may support display(s) 14, sensors 16, other components 24, other input-output devices 22, and control circuitry 12.

Figure 2:
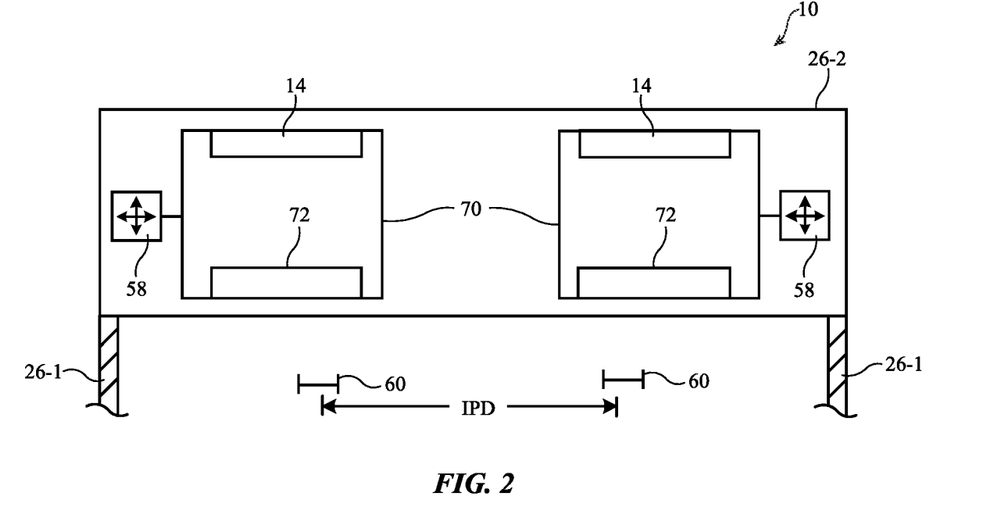
FIG. 2 is a top view of an illustrative head-mounted device in accordance with an embodiment.

FIG. 2 is a top view of electronic device 10 in an illustrative configuration in which electronic device 10 is a head-mounted device. As shown in FIG. 2, electronic device 10 may include support structures (see, e.g., support structures 26 of FIG. 1) that are used in housing the components of device 10 and mounting device 10 onto a user's head. These support structures may include, for example, structures that form housing walls and other structures for main unit 26-2 (e.g., exterior housing walls, lens module structures, etc.) and straps or other supplemental support structures such as structures 26-1 that help to hold main unit 26-2 on a user's face so that the user's eyes are located within eye boxes 60.

Display 14 may include left and right display panels (e.g., left and right pixel arrays, sometimes referred to as left and right displays or left and right display portions) that are mounted respectively in left and right display modules 70 corresponding respectively to a user's left eye (and left eye box 60) and right eye (and right eye box). Modules 70, which may sometimes be referred to as lens support structures, lens housings, or lens and display housings, may be individually positioned relative to the housing wall structures of main unit 26-2 and relative to the user's eyes using positioning circuitry such as respective left and right positioners 58. Positioners 58 may be stepper motors, piezoelectric actuators, motors, linear electromagnetic actuators, and/or other electronic components for adjusting lens module positions. Positioners 58 may be controlled by control circuitry 12 during operation of device 10. For example, positioners 58 may be used to adjust the spacing between modules 70 (and therefore the lens-to-lens spacing between the left and right lenses of modules 70) to match the interpupillary distance IPD of a user's eyes. This allows the user to view the left and right display portions of display 14 in the left and right lens modules.

Figure 3:
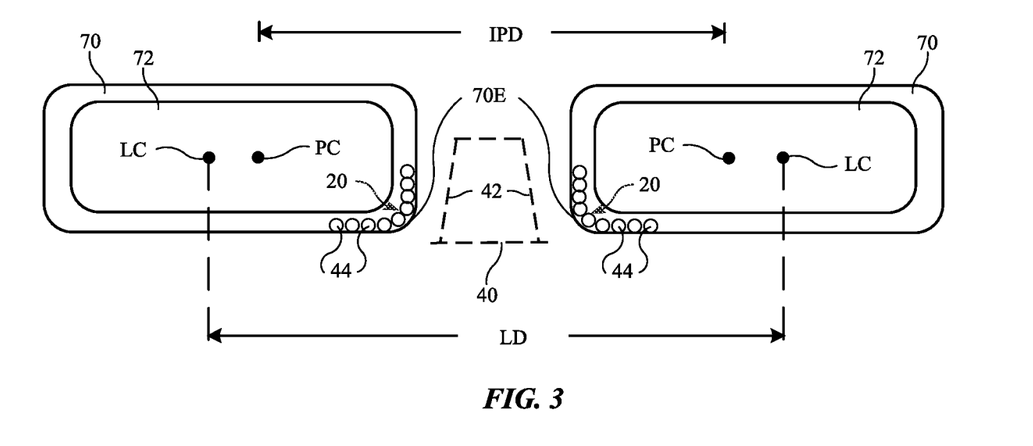
FIG. 3 is a front view of a pair of lenses for a head-mounted device in accordance with an embodiment.

As shown in FIG. 3, the inner edges of left and right lens modules 70 may be adjacent to corresponding side surfaces 42 of the user's nose 40 when device 10 is being worn on a user's head. To ensure that display 14 is viewable by the user when the user's eyes are located in eye boxes 60 (FIG. 2), control circuitry 12 attempts to align lens centers LC with the centers PC of the user's eyes. At the same time, control circuitry 12 uses sensor circuitry such as proximity sensors 20 to detect the position of inner edges 70E of lens modules 70 relative to nose side surfaces 42 to ensure that lens modules 70 do not press excessively on nose 40 and cause discomfort.

In scenarios in which the user's nose is small, there may be ample room available to align lens centers LC with eye centers PC. In scenarios in which the user's nose is larger, control circuitry 12 may position modules 70 as shown in FIG. 3, where lens-to-lens spacing LD is larger than would be desired for perfect alignment of lens centers LC with eye centers PC. The user of this wider lens-to-lens spacing helps ensure that edges 70E of lens modules 70 will not exert more inward force on surfaces 42 of nose 40 than would be comfortable to a user, while still allowing satisfactory viewing of content on display 14 through lenses 72. Lens module surfaces 70E may be placed at a non-zero distance (gap) from corresponding adjacent surfaces 42 as shown in FIG. 3 or may rest gently against surfaces 42. A user may select which of these options is most comfortable to the user and/or a default setting may be supplied to control circuitry 12.

Any suitable detection circuitry may be used to measure the distance between nose surface 42 and edge 70E of each lens module 70. For example, each lens module 70 may have a proximity sensor 20 with a set of multiple capacitive proximity sensor electrodes 44 that are used in detecting direct contact and/or proximity of nose surface 42. As another example, proximity sensor 20 may be an ultrasonic proximity sensor that gathers information on the distance between nose surface 42 and edge 70E by emitting ultrasonic audio signals with a speaker or other transducer and detecting corresponding reflected audio signals with a microphone. If desired, proximity sensor 20 may include a light-emitting device such as an infrared light-emitting diode that emits infrared light and a corresponding light detector such as an infrared photodetector that detects corresponding reflected light from nose surface 42 to measure the distance between sensor 20 and nose surface 42. Other arrangements for measuring the separation between nose surface 42 and module edge 70E may be used, if desired. For example, sensor 20 may include switches for contact sensors that change state when pressed against nose surface 42, may contain force sensors (e.g., resistive force sensors, capacitive force sensors, strain gauges, optical force sensors, etc.) that detect pressure on sensor 20 due to contact between edge 70E (and sensor 20) and corresponding nose surface 42, etc. Proximity information may also be gathered using feedback from motors in positioners 58 (e.g., motors and associated sensing and control circuitry may be used to form force-feedback motor-based sensors).

Figure 4:
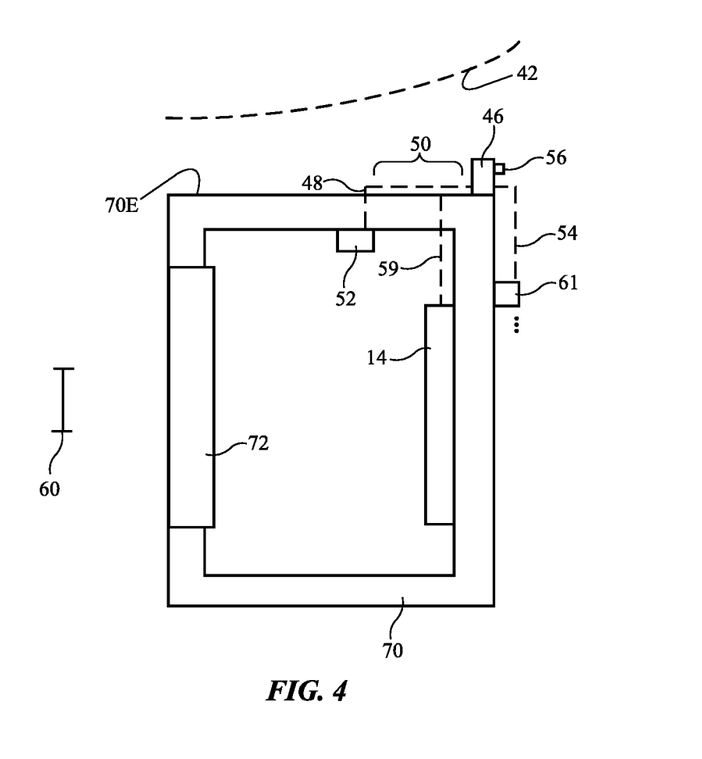
FIG. 4 is a cross-sectional view of an illustrative lens module with a proximity sensor in accordance with an embodiment.

As shown in the illustrative configuration of FIG. 4, proximity sensor 20 may be formed from capacitive sensor electrodes 44 (FIG. 3) that are located on flexible printed circuit 48 in region 50 (e.g., on the exterior of lens module 70). Flexible printed circuit 48 may be located on the inner edge 70E of module 70, facing user nose surface 42. Flexible printed circuits such as printed circuit 48 may be formed from flexible printed circuit substrates with metal traces. The flexible printed circuit substrates may be formed from sheets of polyimide or flexible layers of other polymers. The metal traces may form signal lines for conveying data and power signals and may include pads that form capacitive proximity sensor electrodes 44 (FIG. 3).

The flexible printed circuits of module 70 may be used in interconnecting electrical components associated with module 70. As shown in FIG. 4, a connection hub such as hub 46 may be mounted to an exterior portion of module 70. Hub 46 may include a connector such as connector 56 that is configured to mate with a cable or other signal path (e.g., to couple module 70 to control circuitry 12). Hub 46 may be coupled to gaze tracking sensor 52 using flexible printed circuit 48, may be coupled to display 14 using flexible printed circuit 59, and may be coupled to additional components 61 using flexible printed circuit 54.

Gaze tracking sensor 52 and other components for device 10 such as display 14 may be sealed within the interior of the lens module support structures (e.g., lens module housing walls) of lens module 70. As shown in FIG. 4, lens 72 may be mounted within a wall of module 70. Gaze tracking sensor 52 may have a light source that emits beams of infrared light onto a user's eye in eye box 60 through lens 72 and may have an infrared image sensor that captures images of the user's eye when the user's eye is illuminated by the infrared light beams, thereby allowing gaze tracking sensor 52 to identify the direction of gaze of the user's eye and the location of eye center PC of the user's eye. By using a gaze tracking sensor 52 in each lens module 70, control circuitry 12 can measure the user's interpupillary distance IPD (FIG. 3). In measuring the interpupillary distance, control circuitry 12 can determine the position of each gaze tracking sensor and its lens module (and/or control circuitry 12 can determine lens-to-lens spacing LD) using information from the positioner that is adjusting that lens module and/or additional lens module position sensors (e.g., an optical encoder, etc.). This allows gaze tracker measurements of the user's eye center locations relative to the gaze tracking sensors to be used in measuring interpupillary distance IPD.

Additional components 61 may include display components and other light-emitting components (e.g., light-emitting diodes, lasers, lamps, etc.), sensors 16 (e.g., biometric sensors, environmental sensors, an optical position encoder and/or other sensors for measuring the position of lens modules 70 and thereby determining the lens-to-lens spacing of lenses 72 and the positions of gaze trackers 52, and/or other sensors 16).

Figure 5:
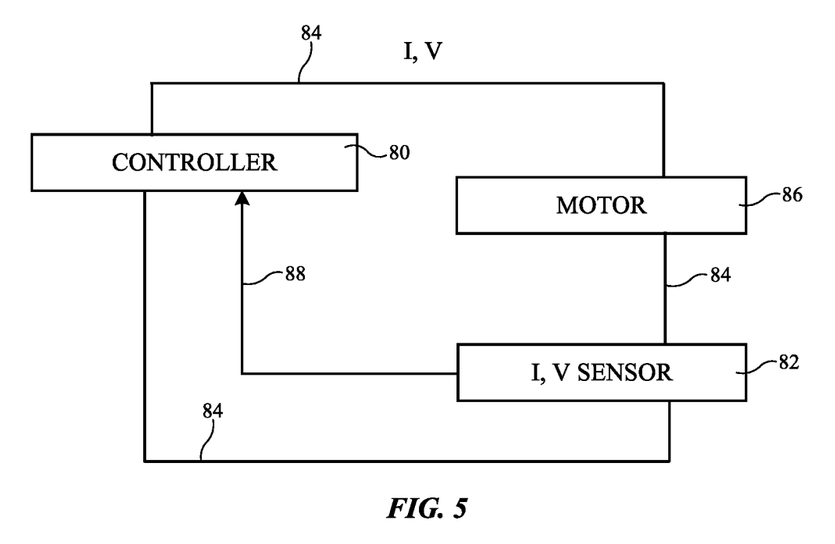
FIG. 5 is a circuit diagram of an illustrative control circuit for controlling a positioner motor while monitoring for feedback from the motor in accordance with an embodiment.
Figure 6:
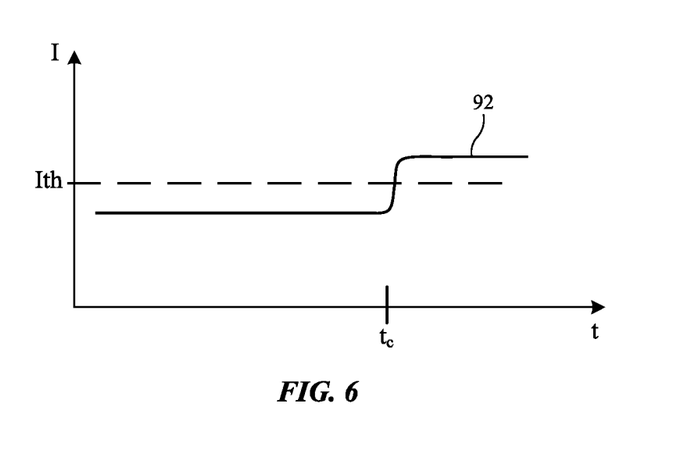
FIG. 6 is a graph of an illustrative lens positioner motor current as a function of time showing how feedback from the motor may be analyzed so that the motor serves as a proximity sensor in accordance with an embodiment.

If desired, the position of lens modules 70 (e.g., each lens module edge 70E) relative to the corresponding surfaces of nose 40 (e.g., each nose surface 42) may be measured using feedback from motors in positioners 58 as lens modules 70 are moved into contact with nose surfaces 42. An illustrative control circuit for a positioner such as positioner 58 is shown in FIG. 5. Control circuitry 12 (FIG. 1) may include a motor controller such as controller 80. Controller 80 may drive motor 86 in a positioner 58 to move an associated lens module 70 by suppling a power supply voltage Vin to motor 86 using path 84. While voltage Vin is being supplied to motor 86, controller 80 of control circuitry 12 monitors the resulting current flow (current I) through path 84 using sensor circuit 82 (e.g., a current sensing resistor with a corresponding analog-to-digital converter circuit, etc.). Power supply voltage Vin may remain relatively constant while motor 86 moves lens module 70. Positioner 58 may initially be used to position edge 70E at a location that is distant from nose surface 42. Control circuitry 12 may then direct positioner 58 to move lens module 70 toward nose 40 until edge 70E contacts nose surface 42. Curve 92 of FIG. 6 represents the current I that flows through path 84 as sensed by sensor 82. As shown in FIG. 6, current I may initially be below threshold value Ith. So long as the movement of module 70 is unimpeded by nose 40, the value of current I may remain at this low value. When, however, edge 70E contacts nose surface 42, motion of module 70 is impeded and current I through motor 86 of positioner 58 will rise above Ith, as shown at time tc of FIG. 6. When current I is detected as exceeding Ith, control circuitry 12 can conclude that module edge 70E is contacting nose surface 42. Based on this detected contact between module 70 and nose 40, control circuitry 12 can determine the position of module 70 relative to nose 40 (e.g., motor 86 can be used as part of a motor-feedback proximity sensor and feedback from motor 86 can serve as a proximity sensor signal for control circuitry 12).

Figure 7:
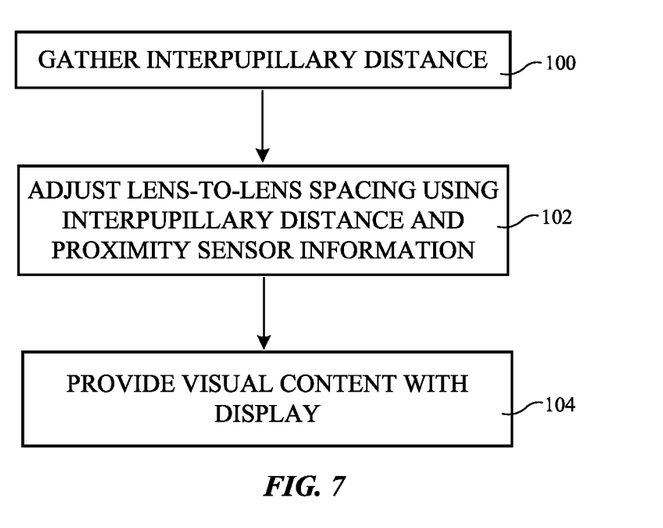
FIG. 7 is a flow chart of illustrative steps involved operating a head-mounted device in accordance with an embodiment.

Illustrative operations involved in operating device 10 in system 8 are shown in FIG. 7.

During the operations of block 100, information on the distance between the user's eyes (interpupillary distance IPD, sometimes referred to as pupillary distance) may be gathered. With one illustrative arrangement, device 10 or other equipment in system 8 gathers the user's interpupillary distance from the user by prompting the user to type the interpupillary distance into a data entry box on display 14 or a display in other equipment in system 8. The user may also supply the user's interpupillary distance using voice input or other user input arrangements. With another illustrative arrangement, a sensor in device 10 or other a sensor in a stand-alone computer, portable device, or other equipment in system 8 may measure the user's interpupillary distance. For example, a sensor such as a two-dimensional or three-dimensional image sensor may gather an image of the user's face to measure the value of interpupillary distance IPD. After the measurement of the interpupillary distance has been made, the interpupillary distance may be provided to device 10 (e.g., over a wired or wireless communications paths). If desired, gaze trackers 52 may measure the locations of the centers of the user's eyes PD and thereby determine IPD from direct measurement as a user is wearing device 10 on the user's head.

After gathering interpupillary distance IPD, control circuitry 12 of device 10 may, during the operations of block 102, use positioners 58 to adjust the spacing LD between lens centers LC so that this distance matches interpupillary distance IPD and so that the centers of lenses 72 are aligned with respective eye centers PC. While positioners 58 are moving lens modules 70 and lenses 72 (e.g., while spacing LD is being reduced to move modules 70 towards adjacent surfaces of the user's nose), control circuitry 12 uses proximity sensor circuitry (e.g., proximity sensor 20) to monitor the distance between each lens module edge 70E and an adjacent surface 42 of nose 40. In some situations, the user's nose 40 will prevent lenses 72 from being brought sufficiently close to each other to allow LD to exactly match IPD without creating a risk of discomfort for the user. Discomfort is prevented by using proximity sensor information to limit the amount of pressure exerted by each edge 70E on the adjacent nose surface 42 or to limit the movement of edge 70E towards nose surface 42 sufficiently to ensure that a non-zero gap G (e.g., a gap G of at least 0.1 mm, at least 0.2 mm, at least 1 mm, at least 2 mm, less than 5 mm, or other suitable spacing) is maintained between edge 70E and nose surface 42. The sensor data that is used in limiting the position of edges 70E relative to nose surfaces 42 may be optical proximity sensor data, capacitive proximity sensor data, ultrasonic proximity sensor data, motor feedback proximity sensor data, and/or proximity (distance) data from other sensors (e.g., a force sensor that detects contact with nose surface 42, a contact sensor that has a switch that detects contact with nose surface 42, etc.). If desired, the position of nose surfaces 42 relative to modules 70 may be detected by moving lens modules 70 into contact with surfaces 42 (e.g., so that motor feedback can be gathered during contact between modules 70 and nose 40 and/or so that a contact sensor, force sensor, touch sensor, and/or other sensor may detect nose surfaces 42 by contact) and then backing off lens modules 70 to a desired separation.

Following the positioning of modules 70 at desired locations relative to nose surfaces 42 to ensure user comfort while wearing device 10, control circuitry 12 may use display 14 to present visual content to the user through lenses 72 (block 104).

As described above, one aspect of the present technology involves sensing the relative positions between lenses in a head-mounted device and a user's nose. The present disclosure contemplates that in some instances, the operation of the head-mounted device will involve gathering user data such as information on the positions of a user's eyes and nose. This gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, facial information, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide facial data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. A head-mounted device, the head-mounted device comprising:
    a support structure;
    a display in the support structure;
    first and second lens modules in the support structure;
    sensors configured to determine whether the first and second lens modules are applying pressure to a nose; and
    positioning circuitry configured to adjust positions of the first and second lens modules based on an interpupillary distance and measurements from the sensors.

2. The head-mounted device of claim 1, wherein the sensors are configured to determine whether the first and second lens modules are applying pressure to the nose that is above a threshold.

3. The head-mounted device of claim 2, wherein the positioning circuitry is further configured to stop moving the first and second lens modules toward the nose in response to determining that excessive pressure has been applied to the nose.

4. The head-mounted device of claim 3, wherein the positioning circuitry is further configured to back the first and second lens modules off of the nose.

5. The head-mounted device of claim 1, further comprising:
an additional sensor coupled to the support structure, wherein the additional sensor is configured to measure the interpupillary distance.

6. The head-mounted device of claim 5, wherein the additional sensor comprises a gaze tracking sensor.

7. The head-mounted device of claim 6, wherein the gaze tracking sensor comprises an infrared image sensor.

8. The head-mounted device of claim 1, further comprising:
an optical position encoder configured to determine the positions of the first and second lens modules.

9. The head-mounted device of claim 1, wherein the positioning circuitry comprises a motor, the sensors comprise a motor feedback sensor, and the sensors are configured to determine if the first and second lens modules are applying pressure to the nose based on the motor feedback sensor.

10. The head-mounted device of claim 1, wherein the sensors comprise force sensors configured to detect pressure applied to the nose by the first and second lens modules.

11. The head-mounted device of claim 10, wherein the force sensors comprise strain gauges.

12. The head-mounted device of claim 1, wherein the sensors comprise proximity sensors.

13. A head-mounted device, comprising:
a support structure;
first and second displays in the support structure;
left and right lens modules in the support structure, wherein the left lens module includes the first display and a left lens and the right lens module includes the second display and a right lens;
sensors that determine whether the right and left lens modules are applying pressure to a nose; and
a positioner configured to move the left and right lens modules toward the nose based on an interpupillary distance, wherein the positioner is configured to stop moving the left and right lens modules toward the nose in response to determining that the right and left lens modules are applying pressure to the nose that exceeds a threshold.

14. The head-mounted device of claim 13, wherein the positioner is further configured to back off the left and right lens modules from the nose.

15. The head-mounted device of claim 13, wherein the sensors comprise force sensors one the left and right lens modules.

16. The head-mounted device of claim 13, wherein the positioner comprises a motor, and the sensors comprise a motor feedback sensor.

17. The head-mounted device of claim 13, further comprising:
an optical sensor configured to measure the interpupillary distance.

18. The head-mounted device of claim 17, wherein the optical sensor comprises an infrared light source and an infrared image sensor.

19. A head-mounted device comprising:
a first lens module that includes a first display and a first lens;
a second lens module that includes a second display and a second lens;
sensors configured to detect positions of the first and second lens modules relative to sides of a nose; and
a positioning system configured to move the first lens module and the second lens module to adjust a lens-to-lens spacing between the first lens and the second lens based on an interpupillary distance and the positions of the first and second lens modules.

20. The head-mounted device of claim 19, wherein the positioning system to adjust the lens-to-lens spacing to be larger than the interpupillary distance in response to the sensors determining that the first and second lens modules apply excessive pressure to the nose when the lens-to-lens spacing is equal to the interpupillary distance.

\* \* \* \* \*

UNITED STATES PATENT AND TRADEMARK OFFICE
CERTIFICATE OF CORRECTION

| | |
|---|---|
| PATENT NO. | : 12,061,345 B2 |
| APPLICATION NO. | : 18/330072 |
| DATED | : August 13, 2024 |
| INVENTOR(S) | : Jeremy C. Franklin et al. |

Page 1 of 1

It is certified that error appears in the above-identified patent and that said Letters Patent is hereby corrected as shown below:

In the Claims

Column 12, Line 8, Claim 15 "sensors one the left" should read -- sensors on the left --

Signed and Sealed this
First Day of October, 2024

*Katherine Kelly Vidal*

Katherine Kelly Vidal
*Director of the United States Patent and Trademark Office*